United States Patent [19]

Morikawa

[11] Patent Number: 4,626,952
[45] Date of Patent: Dec. 2, 1986

[54] PROTECTION APPARATUS FOR A TRANSISTOR INVERTER

[75] Inventor: Tetsuo Morikawa, Itami, Japan

[73] Assignee: Mitsubishi Denki Kabushiki Kaisha, Tokyo, Japan

[21] Appl. No.: 644,278

[22] Filed: Aug. 27, 1984

[51] Int. Cl.$^4$ ............................................. H02H 3/42
[52] U.S. Cl. .................................... 361/55; 361/100; 363/56
[58] Field of Search ................... 361/54–57, 361/104, 100; 363/55–58, 80, 98

[56] References Cited

U.S. PATENT DOCUMENTS 3,215,986 11/1965 Shattuck et al. ................... 361/104

FOREIGN PATENT DOCUMENTS 0040373 3/1982 Japan ...................................... 363/56

Primary Examiner—A. D. Pellinen
Assistant Examiner—Jeffrey A. Gaffin
Attorney, Agent, or Firm—Leydig, Voit & Mayer, Ltd.

[57] ABSTRACT

A protection apparatus for a transistor inverter including a detecting circuit connected to a logic circuit detecting the base current and the collector-emitter voltage of a pair of transistors in the inverter to be protected. A logic circuit performs a logical operation on a binary signal based on the base current of one of the transistors and the collector-emitter voltage of the other of the transistors in the pair. When a short circuit in either one of the transistors is detected, the logic circuit operates a protective thyristor which causes a short circuit current to flow through fuses connected to the transistors, thereby electrically cutting off the transistors by the blow out of the fuses.

3 Claims, 4 Drawing Figures

FIG. 4

OUTPUT STATES

| ELEMENT NO.<br>STATE | 11a | 11b | 11c | 11d | 12a | 12b | 13a | 13b | 14 |
|---|---|---|---|---|---|---|---|---|---|
| STATE A | 1 | 0 | 0 | 1 | — | 0 | 0 | 0 | 0 |
| STATE B | 0 | 1 | 1 | 0 | 0 | — | 0 | 0 | 0 |
| STATE C | 0 | 1 | 0 | 0 | — | — | 1 | 0 | — |
| STATE D | 1 | 0 | 0 | 0 | — | — | 0 | 1 | 1 |

PROTECTION APPARATUS FOR A TRANSISTOR INVERTER

BACKGROUND OF THE INVENTION

The present invention relates to a protection apparatus for a transistor inverter which can automatically and electrically isolate the inverter from adjoining electrical equipment when one of the transistors in the inverter short-circuits.

FIG. 1 shows a conventional transistor inverter. In the figure, element number 1 is a DC power supply, elements numbers 2 and 3 are drive circuits which alternately supply base current to transistors 4 and 5, respectively, and elements number 6 and 7 are diodes connected across the transistors 4 and 5, respectively. In actual practice, two identical inverters like the one shown in FIG. 1 would be symmetrically disposed with respect to a load connected to both inverters. However, for the sake of simplicity, the second inverter and the load have been omitted from the figure.

In this conventional inverter, the collector currents for the transistors 4 and 5 are controlled by the base currents. Therefore, if one of the transistors in the inverter short-circuits, the current will still be limited by the other transistor. Since the current is limited, it is difficult to cut off the shorted transistor from the circuit in a short time by means of a fuse. Accordingly, when a number of inverters of this type are operated in parallel such as in an uninterruptible power supply, unless an inverter with a shorted transistor is quickly cut off, it can harmfully influence the other inverters operated in parallel with it.

SUMMARY OF THE INVENTION

It is the object of the present invention to provide a protection apparatus for a transistor inverter which can quickly cut off a short-circuited transistor by means of fuses.

In the present invention, a short circuit in either of the transistors in the inverter which is being protected is detected by a detecting circuit and a logic circuit. The detecting circuit detects the base currents and the collector-emitter voltages of a pair of transistors in the inverter, and the logic circuit performs a logical operation on a binary signal based on the base current of one of the transistors which is detected by the detecting circuit and another binary signal which is based on the collector-emitter voltage of the other transistor. When a short circuit in either of the transistors is detected, a protective means responsive to the output of the logic circuit cuts off the short-circuited transistor by causing a fuse connected to the transistor to blow out.

A protection apparatus according to the present invention for a transistor inverter of the type having an inverter circuit employing a pair of transistors which are alternately turned on and off comprises detecting means for detecting the collector-emitter voltage and the base current of each transistor of the pair of transistors which are alternately turned on and off, logic circuit means for performing a logical operation on a binary signal based on the base current of one of the transistors which is detected by the detecting means and a binary signal based on the collector-emitter voltage of the other transistor, and protective means for cutting off the pair of transistors based on the output of the logic means.

In a preferred embodiment, the protective means comprises a fuse electrically connected to the input side of the inverter circuit and a thyristor which is electrically connected in parallel with the pair of transistors and which is connected to the fuse in such a manner that a short circuit current will flow through the fuse when the thyristor is activated.

BRIEF DESCRIPTION OF THE DRAWINGS

FIG. 4 is a logic diagram of the output states of the logic devices in FIG. 2 during normal and abnormal operation.

DESCRIPTION OF THE PREFERRED EMBODIMENT

Figure 1:
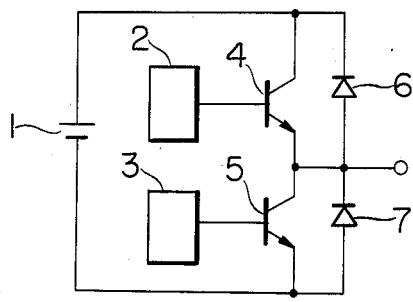
FIG. 1 is a schematic diagram of a conventional transistor inverter.

An embodiment of a protection apparatus according to the present invention will now be described while making reference to FIG. 2 of the attached drawings, which shows a protection apparatus according to the present invention connected to a conventional inverter. In the figure, reference numerals identical to those used in FIG. 1 indicate identical or corresponding parts.

Figure 2:
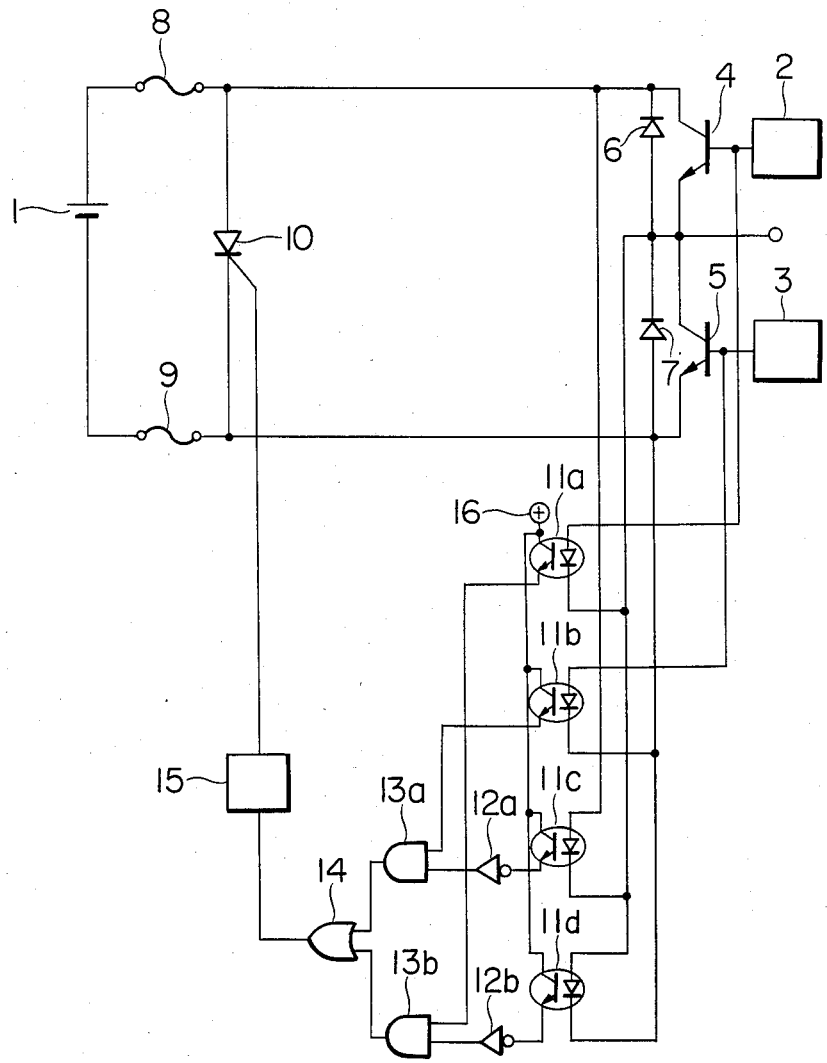
FIG. 2 is a schematic diagram of a protection apparatus for a transistor inverter according to the present invention as used with a conventional inverter.

In FIG. 2, element number 8 is a fuse connected between the voltage supply 1 and the collector of transistor 4, and element number 9 is a similar fuse connected between the voltage supply 1 and the emitter of the other transistor 5. Element number 10 is a thyristor connected between the two fuses 8 and 9. The fuses 8,9 and the thyristor 10 together constitute protective means for cutting off the transistors 4 and 5. Elements number 11a, 11b, 11c, and 11d are photocouplers which together constitute detecting means for detecting the collector-emitter voltage and the base current of each of the transistors 4 and 5. As shown in the figure, photocoupler 11a is connected between the base and the emitter of transistor 4, photocoupler 11b is connected between the base and the emitter of transistor 5, photocoupler 11c is connected between the collector and the emitter of transistor 4, and photocoupler 11d is connected between the collector and the emitter of transistor 5. The photocouplers produce binary outputs in response to the voltages between the leads of the transistors 4 and 5. When drive circuit 2 causes the voltage across the base and emitter $V_{BE}$ of transistor 4 to be high and thereby produces a base current, photocoupler 11a produces a high output and otherwise a low output. When $V_{CE}$ of transistor 4 is low and the transistor is conducting, photocoupler 11c produces a low output and otherwise a high output. Photocouplers 11b and 11d operate in a similar manner.

Elements number 12a and 12b are logical inverters connected to the outputs of photocouplers 11c and 11d, respectively. Element number 13a is an AND gate which receives as inputs the binary output signals from photocoupler 11b and logical inverter 12a, and element number 13b is a similar AND gate which receives as inputs the output signals from photocoupler 11a and logical inverter 12b. Element number 14 is an OR gate which receives as inputs the output signals from the AND gates 13a and 13b. Elements number 12a, 12b, 13a, 13b, and 14 together constitute logic circuit means for performing a logical operation on a binary signal based on the base current of one of the transistors which is detected by the detecting means and a binary signal based on the collector-emitter voltage of the other transistor in the pair of transistors 4 and 5.

Element number 15 is a gate circuit which controls the thyristor 10 in response to the output signal from the OR gate 14, turning the thyristor 10 on when the output of the OR gate 14 is high, and otherwise turning it off. Element number 16 is the power supply for the photocouplers 11a–11d.

Figure 3:
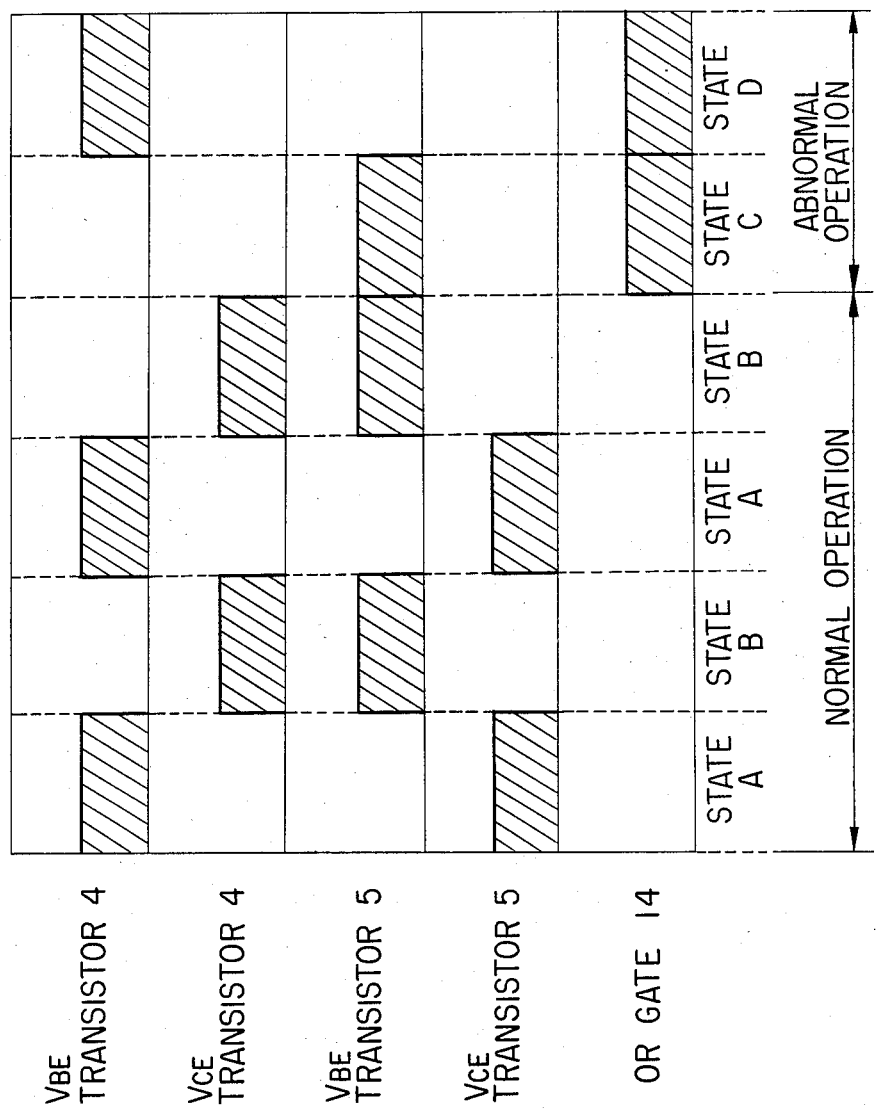
FIG. 3 is a graph of the output of the transistors and the OR gate of FIG. 2 during normal and abnormal operation.

The operation of the protection apparatus illustrated in FIG. 2 will now be described with reference to FIGS. 3 and 4. FIG. 3 shows the base-emitter voltages and collector-emitter voltages of the transistors 4 and 5 and the output of the OR gate 14 during normal and abnormal operation. FIG. 4 is a logic table showing the output states of the logic devices in FIG. 2 during normal and abnormal operation.

The drive circuits 2 and 3 operate to turn the transistors 4 and 5 on and off in alternation, with one transistor on while the other is off. In State A of normal operation when transistor 4 is conducting and transistor 5 is off, $V_{BE}$ of transistor 4 is high, $V_{BE}$ of transistor 5 is low, $V_{CE}$ of transistor 4 is low, and $V_{CE}$ of transistor 5 is high. As can be seen from the top row of FIG. 4, in this state the OR gate 14 is off and the thyristor 10 does not conduct. Similarly, in State B of normal operation when transistor 4 is off and transistor 5 is conducting, $V_{BE}$ of transistor 4 is low, $V_{BE}$ of transistor 5 is high, $V_{CE}$ of transistor 4 is high, and $V_{CE}$ of transistor 5 is low so that the output of the OR gate 14 is low, as shown in the second row of FIG. 4.

If transistor 4 short-circuits, it will conduct even when no base current is flowing in it, and $V_{CE}$ of transistor 4 will be low when it should be high (State C). As can be seen from the third line of FIG. 4, the detecting means and the logic circuit means of FIG. 2 detect this abnormal state and the outputs of AND gate 13a and of OR gate 14 go high. The high output of OR gate 14 activates the gate circuit 15 which turns on the thyristor 10. When thyristor 10 is turned on, a short circuit current then flows through the fuses 8 and 9 which blow out to electrically cut off the transistors.

Alternatively, if transistor 5 short-circuits, it will conduct even when no base current is flowing in it, and $V_{CE}$ of transistor 5 will be low when it should be high (State D). The detecting means and the logic circuit means of FIG. 2 can also detect this abnormal state. As shown in the fourth line of FIG. 4, the outputs of AND gate 13b and of OR gate 14 go high, and the gate circuit 15 is activated to turn on the thyristor 10 and produce a short circuit current which causes the fuses 8 and 9 to blow out, thereby electrically cutting off the transistors 4 and 5.

Thus, when either one of the transistors 4 and 5 of the inverter short-circuits, the protection apparatus according to the present invention can quickly cut off the inverter by causing the fuses 8 and 9 to blow out, thereby preventing neighboring electrical equipment from being damaged.

The protection apparatus according to the present invention can therefore be used highly effectively in equipment in which a number of inverters are operated in parallel such as an uninterruptible power supply.

What is claimed is:

1. In an inverter circuit having a pair of transistors connected in series across a power source and drive circuits alternately turning said transistors on and off, said transistors having collector-emitter voltages and base currents corresponding to the on and off states of said transistors, a protection apparatus comprising:
   means for detecting the on and off states of said transistors and for producing combinations of binary signals representing said on and off states;
   means including a logic circuit connected to said detecting means for performing logical operations on said binary signals and for providing a first output signal representing normal operation of said inverter circuit as a result of a logical operation based on a first combination of binary signals or a second output signal representing a short circuit in either of said transistors as a result of a logical operation based on a second combination of binary signals; and
   means for electrically disconnecting said pair of transistors from said power source operated responsive to said second output signal, the normal operation of said inverter circuit being maintained when said first output signal is provided.

2. A protective apparatus as claimed in claim 1 wherein said detecting means includes photocouplers for detecting collector-emitter voltage and base current of each of the transistors of said pair, and said means for disconnecting comprises a fuse electrically connected to an input side of said inverter circuit and a thyristor electrically connected in parallel with said pair of transistors, said second output signal is input to activate said thyristor, and said fuse is connected to electrically disconnect said pair of transistors from said power source when said thyristor is activated.

3. A protective apparatus as claimed in claim 1, said detecting means including a circuit detecting said collector-emitter voltage and said base current of each of said transistors and providing binary signals representing the collector-emitter voltages and the base currents, said logic circuit providing said first and second output signals responsive to first and second combinations of binary signals representing the base current of one of said transistors and the collector-emitter voltage of the other of said transistors.

* * * * *